United States Patent
Dams

(10) Patent No.: US 7,385,679 B2
(45) Date of Patent: Jun. 10, 2008

(54) LITHOGRAPHIC APPARATUS AND ACTUATOR

(75) Inventor: Johannes Adrianus Antonius Theodorus Dams, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 471 days.

(21) Appl. No.: 11/214,053

(22) Filed: Aug. 30, 2005

(65) Prior Publication Data

US 2006/0139617 A1 Jun. 29, 2006

Related U.S. Application Data

(63) Continuation-in-part of application No. 11/024,042, filed on Dec. 29, 2004, now Pat. No. 7,307,689.

(51) Int. Cl.
   *G03B 27/62* (2006.01)
   *G03B 27/58* (2006.01)
   *H02K 41/00* (2006.01)

(52) U.S. Cl. .............. 355/75; 355/72; 310/12

(58) Field of Classification Search ............ 355/53, 355/72–76; 310/10, 12; 318/640, 649
   See application file for complete search history.

(56) References Cited

U.S. PATENT DOCUMENTS

| | | | |
|---|---|---|---|
| 6,304,320 B1 * | 10/2001 | Tanaka et al. | 355/73 |
| 6,509,957 B1 | 1/2003 | Tanaka | |
| 6,654,100 B2 | 11/2003 | Yoda | |
| 6,717,296 B2 | 4/2004 | Hol et al. | 310/12 |
| 7,057,370 B2 | 6/2006 | Touzov | |
| 7,126,666 B2 * | 10/2006 | De Weerdt et al. | 355/53 |

\* cited by examiner

*Primary Examiner*—Hung Henry Nguyen
(74) *Attorney, Agent, or Firm*—Pillsbury Winthrop Shaw Pittman LLP

(57) ABSTRACT

A lithographic apparatus is arranged to transfer a pattern from a patterning device onto a substrate and includes an electromagnetic actuator to actuate a part of the lithographic apparatus in a linear direction or in a rotational direction. The actuator has a substantially stationary part and a movable part interacting with each other. The stationary part has a plurality of coils and a magnetic circuit of magnetizable material, and the movable part has a magnet system. The magnet system has an array of magnets forming a magnet array having opposite ends. The magnet array has an array of primary magnets and an array of subsidiary magnets alternating with the primary magnets. A direction of polarization of an end primary magnet at an end position of the array of primary magnets differs from a direction of polarization of an intermediate primary magnet at an intermediate position between the end primary magnets.

30 Claims, 3 Drawing Sheets

US 7,385,679 B2

LITHOGRAPHIC APPARATUS AND ACTUATOR

PRIORITY CLAIM

The present invention is a continuation-in-part of U.S. patent application Ser. No. 11/024,042, filed Dec. 29, 2004, which is incorporated by reference in its entirety herein.

BACKGROUND

Field of the Invention

The present invention relates to a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithographic and other apparatus, a number of movable structures or components are driven by electromagnetic actuators for obtaining a fast and accurate position, speed, acceleration, jerk, snap, etc. of each moving component. An example of such a moving component in a lithographic apparatus is a reticle mask, a reticle stage for supporting a reticle, or a wafer stage for supporting a substrate.

Linear electromagnetic actuators, i.e., electromagnetic actuators performing a linear movement, sometimes utilize an iron core concept having a stationary part manufactured at least partly from a magnetized or magnetizable material interacting with at least one movable electromagnetic coil being connected to a component or structure to be moved. The coil may be wound around a core of a magnetized or magnetizable material. By energizing the coil or coils in an appropriate way with an electric current, the coil or coils move in a predetermined direction relative to the stationary part. A position, speed, acceleration, jerk, snap, etc. of the moving coil or coils and its associated component may be generated by selecting and shaping the current within the design boundaries. A one-phase or three-phase or multiple-phase current and coil system may be employed.

When the coils are moved, power cables for supplying current, sensor lines for providing sensing signals, air supply ducts for air bearings and/or cooling water ducts must be movable also, since they must be connected to the moving coil(s) and/or component or structure. Such appending cables, lines and ducts add to the moving mass, are generally difficult and expensive to manufacture, to install and to maintain, may cause life-cycle problems and to a certain extent may cause disturbance forces acting on the movable component or structure.

In new generations of lithographic and other apparatus, dimensions of components increase, and thus masses and volumes of components increase. Also, it is desirable to increase acceleration and deceleration of components in order to raise the productivity of the apparatus. For higher masses combined with higher acceleration/deceleration, higher coil currents are needed which generally require a heavier cabling and increased sizes of air supply and/or cooling water ducts as a result of higher dimensions, masses and dissipation. Bearing structures, such as air bearing pads and magnetic pretension plates, may become more extensive and complex to be able to cope with larger forces experienced during movement.

Iron core motors suffer from torque ripples, cogging (preferred positions in zero-current circumstances), K-factor (generated force per ampère) ripples, normal force ripples and other reluctance forces. One or more of these factors may be critical for machine performance. Since the torque ripple, the K-factor ripple and the normal force ripple each are dependent from the current amplitude, an increased current may lead to an increased torque ripple, K-factor ripple and normal force ripple.

SUMMARY

It is desirable to provide a lithographic apparatus comprising an electromagnetic actuator having an improved behaviour showing low or negligible non-current and current related ripples.

In an embodiment of the invention, a lithographic apparatus which is arranged to transfer a pattern from a patterning device onto a substrate, comprises: an electromagnetic actuator configured to actuate a part of the lithographic apparatus, the actuator having a substantially stationary part and a movable part interacting with each other. The stationary part comprises a plurality of coils and a magnetic circuit of magnetizable material, and the movable part comprises a magnet system. The magnet system comprises an array of magnets forming a magnet array having opposite ends, each magnet of the magnet array having a direction of polarization. The magnet array comprises an array of primary magnets. A direction of polarization of an end primary magnet at an end position of the array of primary magnets differs from a direction of polarization of an intermediate primary magnet at an intermediate position between the end primary magnets.

It is noted that a direction of polarization in a magnet is to be considered similar to a direction of magnetic field in the magnet.

In an embodiment of the invention, the magnet array comprises an array of subsidiary magnets, a direction of polarization of the subsidiary magnets being different from the direction of polarization of the primary magnets.

In an embodiment of the invention, each subsidiary magnet is positioned between two adjacent primary magnets.

In an embodiment of the invention, a lithographic apparatus comprises: an illumination system configured to condition a beam of radiation; a patterning device support configured to support a patterning device. The patterning device is configured to pattern the beam of radiation to form a patterned beam of radiation. A substrate support is configured to hold a substrate. A projection system is configured to project the patterned beam of radiation onto a target portion of the substrate. An electromagnetic actuator is configured to actuate a part of the lithographic apparatus, the actuator having a substantially stationary part and a movable part interacting with each other. The stationary part comprises a plurality of coils and a magnetic circuit of magnetizable material, and the movable part comprises a magnet system. The magnet system comprises an array of magnets forming a magnet array having opposite ends, each magnet of the magnet array having a direction of polarization. The magnet array comprises an array of primary magnets. A direction of polarization of an end primary magnet at an end position of the array of primary magnets differs from a direction of polarization of an intermediate primary magnet at an intermediate position between the end primary magnets.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
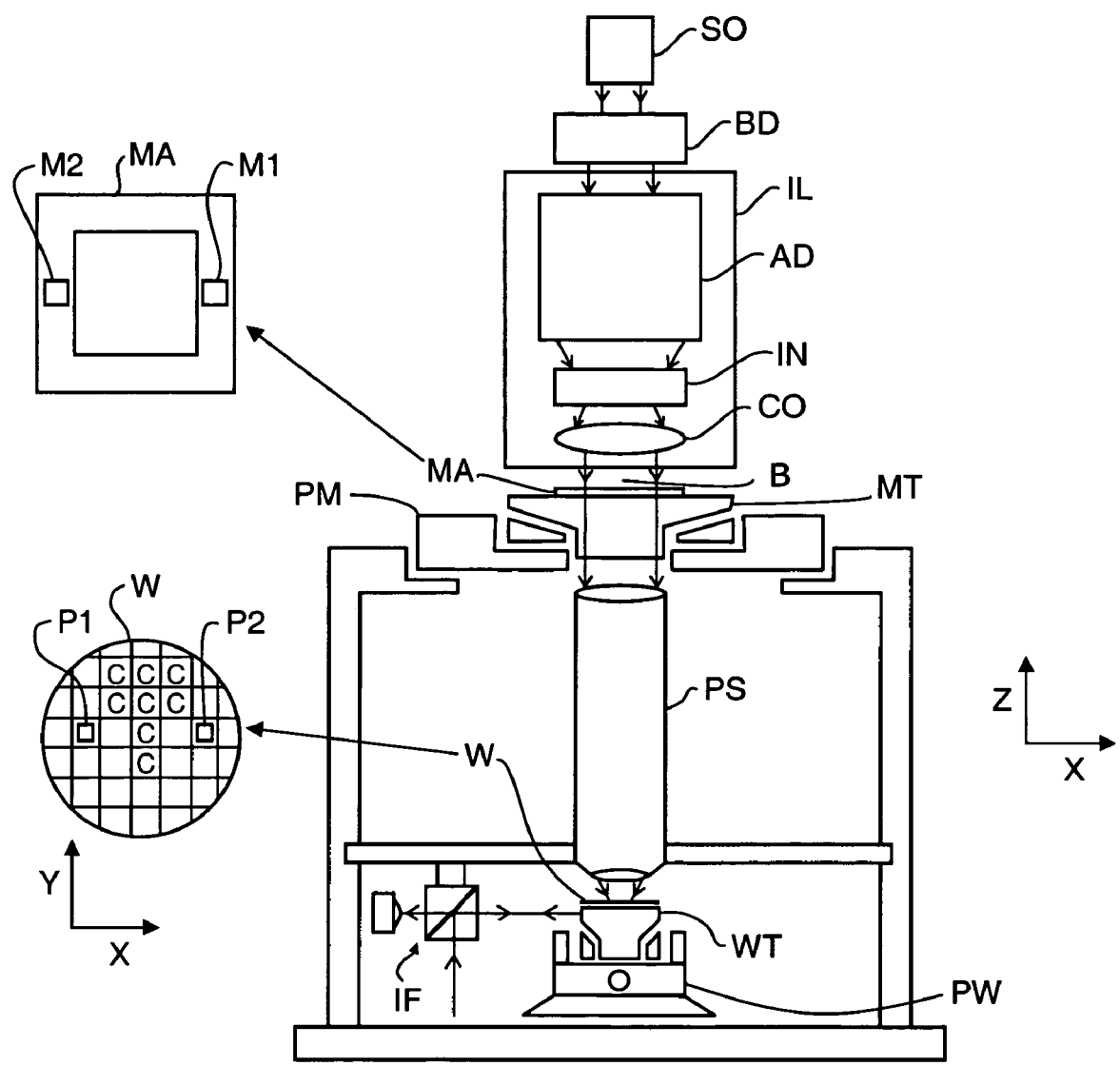
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The first positioning device PM and/or the second positioning device PW may comprise an actuator as described below in more detail with reference to FIG. 2 or FIG. 3. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device.

The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a long-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
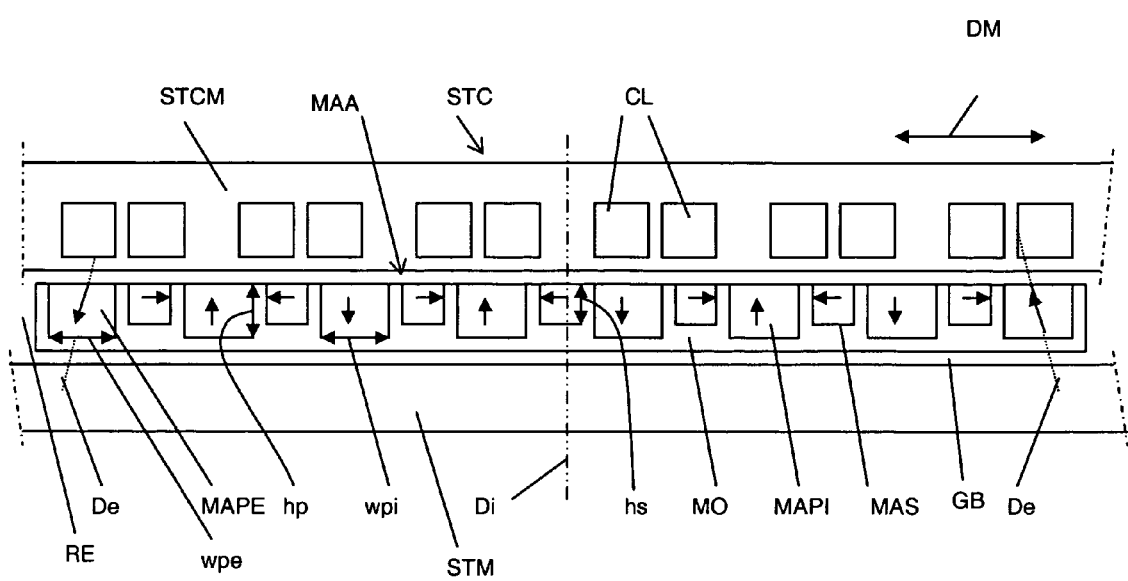
FIG. 2 schematically depicts a view of a linear electromagnetic actuator according to an embodiment the invention.

As depicted in FIG. 2, in an embodiment a stationary part STC of an electromagnetic actuator, such as a linear actuator or a planar actuator, contains a plurality of coils CL which may be evenly distributed along the length of the stationary part STC (which is from left to right in FIG. 2). In FIG. 2, six coils of a greater series of coils are depicted as pairs of cross-sections of coil legs. The stationary part STC comprises a magnetizable material, such as a ferromagnetic material containing iron, in the region STCM outside the coils CL, while between the coils CL and in the coils CL no magnetizable material is provided, but, e.g., a resin which forms a solid coil block, and may be adapted to conduct heat well. The absence of magnetizable material in the coils prevents saturation of such material, cogging, and reluctance forces. A movable part MO of the actuator contains an array of magnets MAA. A stationary part STM contains a magnetizable material. The stationary parts STC and STM are longer than the movable part MO to allow the movable part MO to move along a path in directions indicated by a double arrow DM between ends (not shown) of the stationary parts STM, STC, in other words, opposite ends of the movable part MO lie between opposite ends of the stationary parts STM, STC. The stationary parts STC and STM may be connected to each other to form a stator of the actuator, the movable part MO being situated in a recess of such a stator. The stationary part STC is provided with coils CL along its length at positions which may come to lie opposite the movable part MO along its travel path.

The stationary part STC includes the coils CL, which reduces any heating effects, as a generation of heat in the coils CL when in operation can more easily be handled than a generation of heat in the movable part MO. The stationary part STC offers sufficient possibilities for heat sinking, contrary to the movable part MO.

A gas bearing GB may be present between the movable part MO and the stationary part STM. A force generated by the gas bearing GB as such will be a force in an upward direction (as seen in the plane of drawing of FIG. 2). A difference in, on the one hand, an attracting magnetic force exerted between the stationary part STC and the movable part MO (generated essentially by energizing the coils CL interacting with the magnet array MAA) and, on the other hand, an attracting magnetic force exerted between the movable part MO and the stationary part STM (generated essentially by the magnet array MAA interacting with the stationary part STM) provides a pretension force (preload) on the gas bearing GB in a downward direction (as seen in the plane of drawing of FIG. 2). In normal operation, the force generated by the gas bearing GB as such, the resulting force generated by the attracting magnetic forces, and the force of gravity will together create a state of equilibrium in which the movable part MO may move on the gas bearing relative to the stationary parts STC and STM.

In an embodiment, the stationary part, which includes the stationary part STC and the stationary part STH, may have a recess RE accommodating the moving part MO, the stationary part STC bounding the recess RE at an upper part thereof, and the stationary part STM bounding the recess RE at a lower part thereof. The gas bearing GB is then situated at the lower part of the recess RE between the stationary part STC and the moving part MO.

The magnet array MAA may be in a configuration as described in U.S. Pat. No. 6,717,296, which is incorporated herein by reference. The magnet array MAA may comprise an array of primary magnets and an array of subsidiary magnets MAS. The primary and subsidiary magnets may be fixed in a support of a non-magnetic material. The movable part may, e.g., comprise a metal part, such as an aluminum part, provided with one or more recesses for the primary and subsidiary magnets. Any space between the primary and the subsidiary magnets may be filled by a hardenable material, such as a resin.

The array of primary magnets comprises end primary magnets MAPE at an end position of the array of primary magnets, and intermediate primary magnets MAPI at an intermediate position between the end primary magnets MAPE. The primary magnets are spaced from each other.

The subsidiary magnets MAS alternate with the primary magnets. Each subsidiary magnet MAS may be positioned between two adjacent primary magnets. A distance may be provided between a subsidiary magnet and an adjacent primary magnet, and the space thus created may be filled by a hardenable material, such as a resin. In an embodiment (not shown) a subsidiary magnet MAS may be omitted between an end primary magnet MAPE and the adjacent intermediate primary magnet MAPI, resulting in each subsidiary magnet MAS being positioned between two adjacent intermediate primary magnets MAPI.

The intermediate primary magnets MAPI have a width wpi (indicated by a double arrow) in a width direction parallel to the end-to-end direction of the magnet array MAA, and have a length perpendicular to the width direction (in FIG. 2 perpendicular to the plane of the drawing). A width wpe (indicated by a double arrow) of the end primary magnets MAPE may be equal to the width wpi of the intermediate primary magnets MAPI. In an embodiment (not shown) the width wpe may be smaller or larger than the width wpi.

A pitch, i.e., a center-to-center distance, of the intermediate primary magnets MAPI may be the same between every consecutive pair of intermediate primary magnets MAPI in the magnet array MAA. A pitch between an end primary magnet MAPE and an adjacent intermediate primary magnet MAPI may be equal to the pitch of the intermediate primary magnets MAPI, or may be smaller or larger than the pitch of the intermediate primary magnets MAPI.

Usually the coils CL form part of a three-phase coil system, where each coil CL is driven by a current having a different phase, the phase of a coil current differing $2\pi/3$ rad from a phase of a current in an adjacent coil. Thus, in a three-phase coil system, the number of coils is three or a multiple of three. The number of primary magnets is chosen such that the sum of the pitches of three consecutive coils CL is substantially equal to the sum of the pitches of four consecutive primary magnets. Hence, for every tree coils CL, there are four primary magnets. In FIG. 2 six coils CL are depicted, having a combined pitch being equal to the combined pitch of eight primary magnets.

Each magnet MAPI, MAPE, MAS of the magnet array MAA has a direction of polarization, i.e., direction of magnetic field, indicated by a single arrow in the respective magnet in FIG. 2.

The direction of polarization of the intermediate primary magnets MAPI is perpendicular to the width direction and to the length direction of the intermediate primary magnet MAPI. As can be seen, a direction of polarization of each intermediate primary magnet MAPI is substantially opposite to a direction of polarization of an adjacent intermediate primary magnet MAPI.

A direction of polarization of the subsidiary magnets MAS is different from the direction of polarization of the primary magnets. As can be seen, a direction of polarization of each subsidiary magnet MAS is substantially opposite to a direction of polarization of an adjacent subsidiary magnet MAS. The direction of polarization of the subsidiary magnets MAS is substantially parallel to the end-to-end direction of the magnet array. According to the embodiment of FIG. 2, a direction of polarization of the subsidiary magnets MAS is essentially perpendicular to the direction of polarization of the intermediate primary magnets MAPI.

The array of primary magnets is terminated at each opposite end by an end primary magnet MAPE. If the end primary magnets MAPE would have the same direction of polarization as the intermediate primary magnets MAPI, this would result in a particular change of the magnetic field at a location of the coils CL near the end primary magnets MAPE of the magnet array MAA. Such a change of the magnetic field results in a torque on the movable part MO when operating the actuator, i.e., when electrically powering the coils CL. Due to a spatial periodicity in the magnets and the coils, the generated torque shows a ripple, resulting in a periodic fluctuation of the torque depending on a position of the movable part MO with respect to the stationary part STC. This torque, at certain positions of the movable part MO with respect to the stationary part STC, may rotate the movable part MO such that an edge of the movable part MO is pushed downward (in the plane of the drawing of FIG. 2).

In order to obtain the correct magnetic field strength and polarization direction of the magnetic field running through the coil section directly above the end primary magnets MAPE, and to at least partially reduce the torque ripple mainly caused by the magnetic field near the end of the magnet array MAA, the end primary magnets MAPE may each comprise a direction of polarization De which differs from a direction of polarization Di of the intermediate primary magnets MAPI. A direction of polarization of an end primary magnet MAPE differs from a direction of polarization of an intermediate primary magnet MAPI by an angle between about +45 degrees and −45 degrees (excluding 0 degrees). The directions of polarization of the end primary magnets MAPE may be symmetrical with respect to the direction of polarization of at least one of the intermediate primary magnets MAPI, i.e., where a direction of polarization De of one end primary magnet MAPE may be at a predetermined positive angle to a direction of polarization Di of an intermediate primary magnet MAPI, the direction of polarization De of the other end primary magnet MAPE is essentially the same predetermined, yet negative angle to the direction of polarization Di of the intermediate primary magnet MAPI.

A direction of polarization De of one of the end primary magnets MAPE is oriented towards a center axis (in FIG. 2 the axis Di) of the magnet system, and a direction of polarization of the other one of the end primary magnets MAPE is oriented away from the center axis of the magnet system. The direction of polarization Di of the intermediate primary magnets MAPI is oriented substantially parallel to such a center axis. An effect of the altered direction of polarization of the end primary magnets MAPE is that near an edge of the magnetic field generated by the primary magnets MAPI, MAPE and subsidiary magnets MAS, the magnetic field at the location of the coils CL above the end primary magnets MAPE remains in substantially a same direction as a field at the location of the coils CL in or near a center of the magnet array MAA (i.e., the field by the intermediate primary magnets MAPI and subsidiary magnets MAS). As a result, the torque which may in operation cause the pushing of an edge of the movable part MO into the gas bearing is beneficially reduced: firstly, the position dependent ripple of the torque is reduced. Secondly, an average of the torque is altered, such that the torque in average (i.e., averaging over a periodicity of the ripple) tends to lift a leading edge of the movable part MO as seen in the direction of movement more from the gas bearing—which is considered less problematic—instead of pushing the leading edge of the movable part MO into the gas bearing. Hence, a more stable, more precise moving of the movable part MO and a more favorable dynamic behavior thereof when driving the actuator in either one of the directions DM may be obtained by selecting the directions of polarization De of the end primary magnets MAPE. A further parameter in such optimization process may be found in selecting the pitch between each end primary magnets MAPE and its adjacent intermediate magnet MAPI.

In the embodiment shown in FIG. 2, a height hs (indicated by a double arrow) of the subsidiary magnets MAS is smaller than a height hp (indicated by a double arrow) of the primary magnets MAPI, MAPE. The subsidiary magnets MAS may be positioned such that a center thereof is located closer to the coils CL than a center of the primary magnets MAPI, MAPE. By this positioning, the subsidiary magnets MAS tend to increase a magnetic field at a location of the coils CL in the stationary part STC, while decreasing the magnetic field at the stationary part STM. As indicated above, the magnetic field may be applied to form a preload for a gas bearing GB between the movable part MO and the stationary part STM, thus requiring a certain spatial distribution of the magnetic field to be able to obtain a suitable effective magnetic attracting force between the movable part MO and the stationary parts STC, STM. By choosing a height and location of the subsidiary magnets MAS with respect to the primary magnets, such spatial distribution of the magnetic field, and in particular a relation between a strength of the field in the plane of drawing of FIG. 2 above and below the magnet array MAA, is determined. Thus, by choosing a suitable location and height of the subsidiary magnets MAS in relation to the primary magnets MAPI, MAPE, the magnetic field distribution may be tuned to a certain extent, e.g., to ensure that the magnetic field at the lower side of the magnet array MAA is not reduced too much by the presence of the subsidiary magnets MAS to obtain a preload for the gas bearing which is too low, while at the same time obtaining an increase in the magnetic field at the location of the coils CL by the presence of the subsidiary magnets MAS, thus increasing the performance of the actuator.

A thickness of the stationary part STM is selected in such a way that no magnetic saturation effects take place therein. The stationary part STM may be made from a ferromagnetic material. Its surface facing the movable part MO may be flat and stable enough to form part of the gas bearing GB.

In an embodiment, the remanence of the primary magnets may be essentially equal to, or smaller than, the remanence of the subsidiary magnets.

As may be understood from the above, different magnet array MAA configurations may be used for reducing at least one of a torque ripple, K-factor ripple and normal force ripple. The following measures may be taken either separately or in any combination:

Providing end primary magnets MAPE with a direction of polarization different from a direction of polarization of the intermediate primary magnets MAPI;

Providing end primary magnets MAPE with a width different from, e.g., smaller than, the a width of intermediate primary magnets MAPI;

Providing end primary magnets MAPE which are positioned at a distance or pitch with respect to neighboring intermediate primary magnets MAPI different from, e.g., larger than, the distance or pitch between adjacent intermediate primary magnets MAPI;

Omitting a subsidiary magnet between an end primary magnet MAPE and an adjacent intermediate primary magnet MAPE.

It is further observed that the width of the intermediate primary magnet MAPI adjacent an end primary magnet MAPE may be selected to differ from the width of other intermediate primary magnets MAPI.

In an embodiment of the invention, the torque ripple amplitude may be reduced to about ±20%. The K-factor ripple and the normal force ripple may be reduced to below about ±1%.

The actuator is configured to move a movable structure. The movable structure may include any structure of any size, dimension and for any application, such as for moving a reticle blade, a reticle or a substrate. The actuator may also be used for applications involving a movable structure not being part of a lithographic apparatus.

The term stationary or substantially stationary used in this specification to indicate part of the electromagnetic actuator, is to be understood as stationary or substantially stationary with respect to the movable part. When applying, e.g., spring blades or any other flexible connecting structure to connect a substantially stationary part to the remainder of a lithographic apparatus, the substantially stationary part may move also when the movable part moves. However, the substantially stationary part will come back to a rest or initial position when a movement of the stationary part due to, e.g., a movement of the movable part or due to any other disturbance or vibration has damped out. Further, the substantially stationary part does not need to be positioned in a stationary way relative to a frame of the lithographic apparatus, instead it may be movable or in operation make a movement in any direction. As an example, the actuator and a structure moved by it may as a whole be movable by any other actuator.

Figure 3:
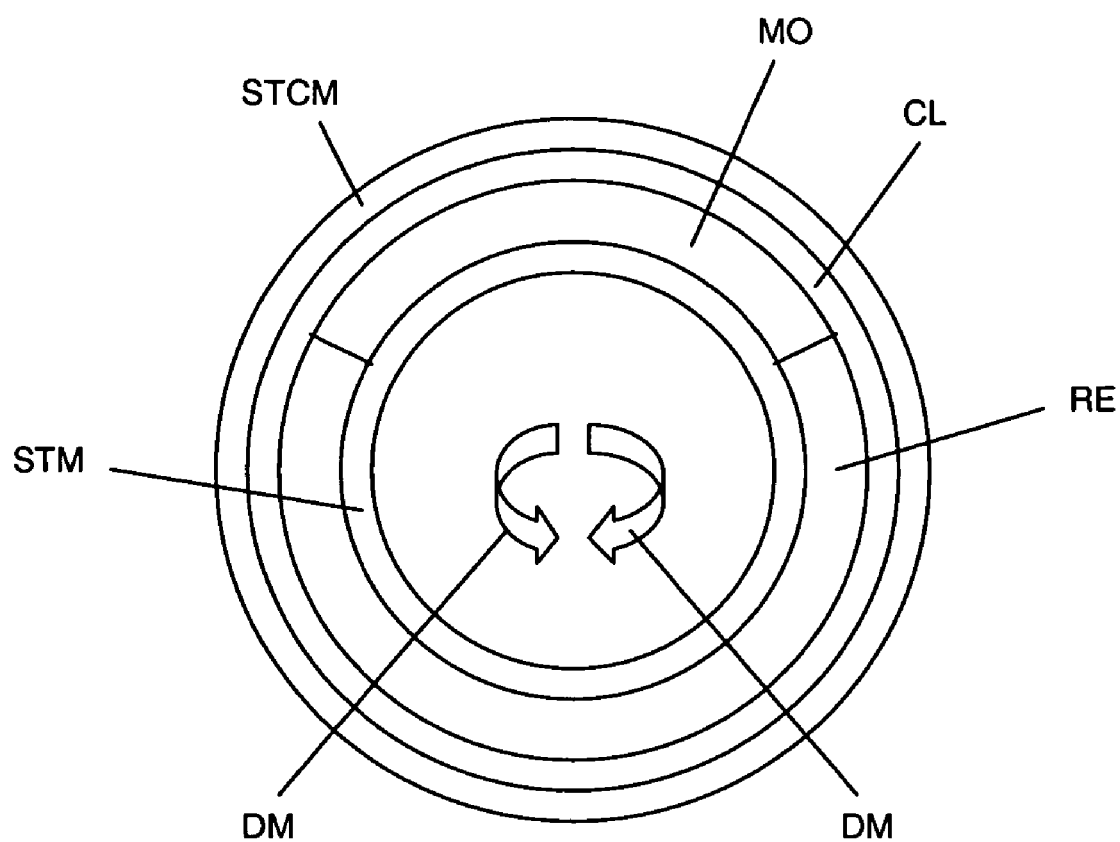
FIG. 3 schematically depicts a view of a rotatable electromagnetic actuator according to another embodiment of the invention.

The actuator may be a linear actuator, as depicted in FIG. 2, and may be a rotational actuator, as depicted in FIG. 3. In FIG. 3, different parts having the same function as parts in FIG. 2, are labeled the same. The actuator of FIG. 3 sometimes is also referred to as a torque motor. The movable part MO is ring sector shaped, contains a magnet array MAA (not shown), and may be movable over a limited angle only relative to the stationary parts of the actuator, or may be fully movable to rotate in any of the two directions DM. The stationary parts generally are ring shaped, where the part indicated with CL contains electric coils (not shown in detail). The different stationary parts are fixed relative to each other, and the movable part MO is suitably mounted relative to the stationary parts, e.g., by an air bearing of the type described above. It will be appreciated that a gap is present between the part indicated with CL and the movable part MO, as well as between the stationary part STM and the movable part MO. As seen from a different perspective, the actuator of FIG. 2 is obtained by cutting the ring shaped stationary parts of the actuator of FIG. 3 open, and stretching them, as well as the movable part MO, to become linear. Like in FIG. 2, in FIG. 3 the movable part MO may be moving in a recess RE of a stationary part comprising the stationary part made of magnetizable material STCM, the coils CL, and the stationary part STM.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that embodiments of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ embodiments of the present invention in virtually any appropriately detailed structure. Further, the terms and phrases used herein are not intended to be limiting; but rather, to provide an understandable description of embodiments of the invention.

The terms "a" or "an," as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A lithographic apparatus arranged to transfer a pattern from a patterning device onto a substrate, the lithographic apparatus comprising:

an electromagnetic actuator configured to actuate a part of the lithographic apparatus, the actuator having a substantially stationary part and a movable part interacting with each other, the stationary part comprising a plurality of coils and a magnetic circuit of magnetizable material, and the movable part comprising a magnet system;

the magnet system comprising an array of magnets forming a magnet array having opposite ends, each magnet of the magnet array having a direction of polarization, the magnet array comprising an array of primary magnets, a direction of polarization of an end primary magnet at an end position of the array of primary magnets differing from a direction of polarization of an intermediate primary magnet, the intermediate primary magnet being arranged at an intermediate position between the end primary magnet and another end primary magnet disposed at another end position of the array of primary magnets.

2. The lithographic apparatus of claim 1, wherein an angle between the direction of the polarization of the end primary magnet and the direction of polarization of the intermediate primary magnet is between about +45 degrees and −45 degrees.

3. The lithographic apparatus of claim 1, wherein the direction of polarization of the end primary magnet and the direction of polarization of the other end primary magnet are essentially symmetrical with respect to the direction of polarization of the intermediate primary magnet.

4. The lithographic apparatus of claim 1, wherein each of the end primary magnet and the other end primary magnet are spaced from an adjacent intermediate primary magnet at a distance which is different from a distance between two adjacent intermediate primary magnets.

5. The lithographic apparatus of claim 1, wherein a distance between two consecutive intermediate primary magnets is substantially constant.

6. The lithographic apparatus of claim 1, wherein a pitch between each of the end primary magnet and the other end primary magnet and an adjacent intermediate primary magnet is different from a pitch between two adjacent intermediate primary magnets.

7. The lithographic apparatus of claim 1, wherein a pitch between two consecutive intermediate primary magnets is substantially constant.

8. The lithographic apparatus of claim 1, wherein the primary magnets have a width in a direction parallel to an end-to-end direction of the magnet array, a width of each of the end primary magnet and the other end primary magnet being different from a width of the intermediate primary magnet.

9. The lithographic apparatus of claim 1, wherein all intermediate primary magnets arranged between the end primary magnet and the other end primary magnet have a same width.

10. The lithographic apparatus of claim 1, wherein the directions of polarization of adjacent intermediate primary magnets are essentially opposite to each other.

11. The lithographic apparatus of claim 1, wherein all intermediate primary magnets arranged between the end primary magnet and the other end primary magnet have a width in a direction parallel to an end-to-end direction of the magnet array, a length perpendicular to the width direction, the direction of polarization of each of the intermediate primary magnets being essentially perpendicular to the width direction and to the length direction.

12. The lithographic apparatus of claim 1, wherein the magnet array comprises an array of subsidiary magnets, a direction of polarization of the subsidiary magnets being different from the direction of polarization of the primary magnets.

13. The lithographic apparatus of claim 1, wherein the magnet array comprises an array of subsidiary magnets, a direction of polarization of the subsidiary magnets being essentially perpendicular to the direction of polarization of the intermediate primary magnet.

14. The lithographic apparatus of claim 12, wherein the direction of polarization of the subsidiary magnets is substantially parallel to an end-to-end direction of the magnet array.

15. The lithographic apparatus of claim 12, wherein the directions of polarization of adjacent subsidiary magnets are essentially opposite to each other.

16. The lithographic apparatus of claim 12, wherein the array of primary magnets includes a plurality of intermediate primary magnets and wherein the plurality of intermediate primary magnets and the subsidiary magnets alternate in the magnet array.

17. The lithographic apparatus of claim 12, wherein each subsidiary magnet is positioned between two adjacent primary magnets.

18. The lithographic apparatus of claim 12, wherein each subsidiary magnet is positioned between two adjacent intermediate primary magnets.

19. The lithographic apparatus of claim 18, wherein a subsidiary magnet is omitted between the end primary magnet and an adjacent intermediate primary magnet.

20. The lithographic apparatus of claim 1, wherein the magnetic circuit comprises a first magnetizable material at a side of the coils facing away from the movable part, and a second magnetizable material at a side of the movable part facing away from the coils.

21. The lithographic apparatus of claim 20, comprising a gas bearing between the movable part and the second magnetizable material.

22. The lithographic apparatus of claim 21, wherein the magnet array provides a predetermined preload of the gas bearing.

23. The lithographic apparatus of claim 21, wherein the magnet array comprises an array of subsidiary magnets, and wherein a height and location of the subsidiary magnets provide a predetermined preload of the gas bearing.

24. The lithographic apparatus of claim 1, wherein the actuator is a linear actuator.

25. The lithographic apparatus of claim 1, wherein the actuator is a planar actuator.

26. The lithographic apparatus of claim 1, wherein the actuator is a rotary actuator.

27. An electromagnetic actuator comprising:
a substantially stationary part and a movable part interacting with each other, the stationary part comprising a plurality of coils and a magnetic circuit of magnetizable material, and the movable part comprising a magnet system;
the magnet system comprising an array of magnets forming a magnet array having opposite ends, each magnet of the magnet array having a direction of polarization, the magnet array comprising an array of primary magnets, a direction of polarization of an end primary magnet at an end position of the array of primary magnets differing from a direction of polarization of an intermediate primary magnet, the intermediate primary magnet being arranged at an intermediate position between the end primary magnet and another end primary magnet disposed at another end position of the array of primary magnets.

28. The actuator of claim 27, wherein the magnet array comprises an array of subsidiary magnets, a direction of polarization of the subsidiary magnets being different from the direction of polarization of the primary magnets.

29. The lithographic apparatus of claim 27, wherein each subsidiary magnet is positioned between two adjacent primary magnets.

30. A lithographic apparatus comprising:
an illumination system configured to condition a beam of radiation;
a patterning device support configured to support a patterning device, the patterning device configured to pattern the beam of radiation to form a patterned beam of radiation;
a substrate support configured to hold a substrate;
a projection system configured to project the patterned beam of radiation onto a target portion of the substrate;
an electromagnetic actuator configured to actuate a part of the lithographic apparatus, the actuator having a substantially stationary part and a movable part interacting with each other, the stationary part comprising a plurality of coils and a magnetic circuit of magnetizable material, and the movable part comprising a magnet system;
the magnet system comprising an array of magnets forming a magnet array having opposite ends, each magnet of the magnet array having a direction of polarization, the magnet array comprising an array of primary magnets, a direction of polarization of an end primary magnet at an end position of the array of primary magnets differing from a direction of polarization of an intermediate primary magnet, the intermediate primary magnet being arranged at an intermediate position between the end primary magnet and another end primary magnet disposed at another end position of the array of primary magnets.

* * * * *